(12) United States Patent
Fenchel et al.

(10) Patent No.: US 10,564,244 B2
(45) Date of Patent: Feb. 18, 2020

(54) ASCERTAINING AN ITEM OF MOVEMENT INFORMATION DESCRIBING A MOVEMENT IN AN AT LEAST PARTIALLY MOVED EXAMINATION REGION

(71) Applicants: Matthias Fenchel, Erlangen (DE); Peter Speier, Erlangen (DE)

(72) Inventors: Matthias Fenchel, Erlangen (DE); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 298 days.

(21) Appl. No.: 15/367,358

(22) Filed: Dec. 2, 2016

(65) Prior Publication Data

US 2017/0160364 A1 Jun. 8, 2017

(30) Foreign Application Priority Data

Dec. 3, 2015 (DE) .................. 10 2015 224 162

(51) Int. Cl.
*G01R 33/567* (2006.01)
(52) U.S. Cl.
CPC ................ *G01R 33/5673* (2013.01)
(58) Field of Classification Search
None
See application file for complete search history.

(56) References Cited

U.S. PATENT DOCUMENTS

| 4,551,680 A | 11/1985 | Macovski |
| 4,712,560 A | 12/1987 | Schaefer et al. |
| 5,938,599 A | 8/1999 | Rasche et al. |

(Continued)

FOREIGN PATENT DOCUMENTS

| CN | 1504761 A | 6/2004 |
| CN | 101273276 A | 9/2008 |

(Continued)

OTHER PUBLICATIONS

German Office Action for related German Application No. 10 2015 224 162.9 dated Apr. 13, 2017, with English Translation.

(Continued)

*Primary Examiner* — Douglas X Rodriguez
(74) *Attorney, Agent, or Firm* — Lempia Summerfield Katz LLC

(57) ABSTRACT

A method is provided for ascertaining at least one item of movement information describing a sought movement as a partial movement of an overall movement in an at least partially moved examination region. In the method, at least one excitation signal having a first frequency band is output and receiving signals generated by the excitation signal are recorded with a receiving coil arrangement, (e.g., a receiving coil arrangement of a magnetic resonance device), having a plurality of receiving channels. The coils of the receiving coil arrangement are designed to record a receiving frequency band including the first frequency band, wherein for ascertaining the movement information the complex receiving signals of the receiving channels are combined at one instant according to a combination specification ascertained over a period by an analysis of the receiving signals that identifies at least one component of a movement that contributes to the sought movement.

24 Claims, 5 Drawing Sheets

(56) References Cited

U.S. PATENT DOCUMENTS

| | | | |
|---|---|---|---|
| 6,512,941 B1* | 1/2003 | Weiss | A61B 5/055 324/300 |
| 2004/0162482 A1 | 8/2004 | Assmann et al. | |
| 2011/0175609 A1 | 7/2011 | Hu et al. | |
| 2014/0121496 A1 | 5/2014 | Bi et al. | |
| 2015/0282764 A1 | 10/2015 | Greiser et al. | |
| 2015/0374237 A1* | 12/2015 | Hu | A61B 5/055 600/413 |
| 2016/0024588 A1 | 1/2016 | Karlsson et al. | |

FOREIGN PATENT DOCUMENTS

| | | |
|---|---|---|
| CN | 103792502 A | 5/2014 |
| DE | 19956595 A1 | 5/2001 |
| DE | 102015203385 A1 | 8/2016 |
| JP | 2001190520 A | 7/2001 |
| KR | 870001814 A | 3/1987 |
| KR | 20150116795 A | 10/2015 |
| WO | WO2014120953 A1 | 8/2014 |

OTHER PUBLICATIONS

Odille, Freddy et al., "Model-Based Reconstruction for Cardiac Cine MRI Without ECG or Breath Holding," Magnetic Resonance in Medicine, vol. 63, pp. 1247-1257 (2010).

Zhang, Tao et al., "Robust Self-Navigated Body MRI Using Dense Coil Arrays," Magnetic Resonance in Medicine, vol. 76, pp. 197-205 (2016).

"Independent component analysis" in: http://en.wikipedia.org/wiki/Independent_component_analysis, Apr. 2015.

"Principal component analysis" in: http://en.wikipedia.org/wiki/Principal_component.analysis, Jul. 2015.

Korean Notice of Allowance for related Korean Application No. 10-2016-0163537 dated Oct. 11, 2018.

Chinese Office Action for related Chinese Patent Application No. 201611103401.5, dated Feb. 26, 2019 with English translation.

* cited by examiner

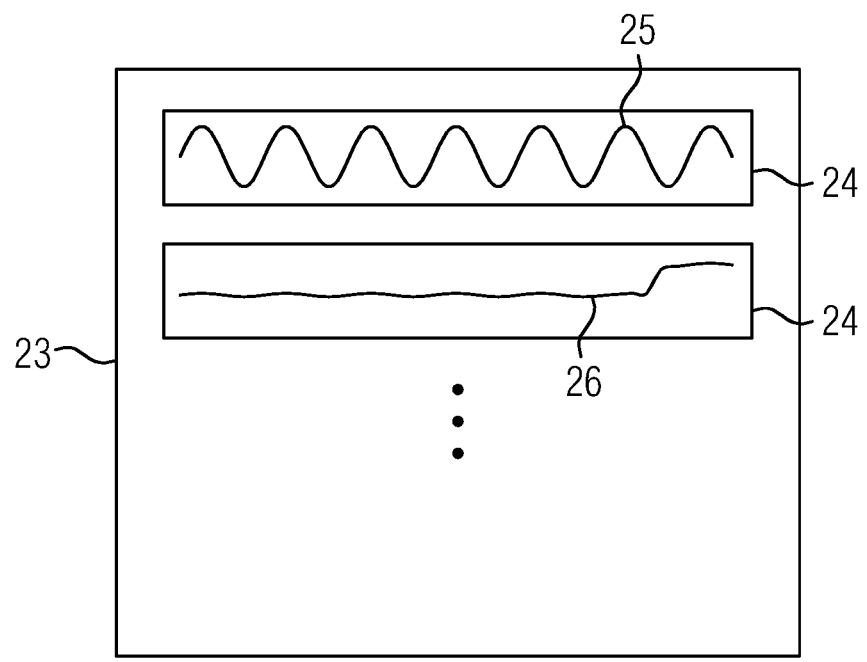

ASCERTAINING AN ITEM OF MOVEMENT INFORMATION DESCRIBING A MOVEMENT IN AN AT LEAST PARTIALLY MOVED EXAMINATION REGION

This application claims the benefit of DE 10 2015 224 162.9, filed Dec. 3, 2015, which is hereby incorporated by reference in its entirety.

TECHNICAL FIELD

The embodiments relate to a method for ascertaining at least one item of movement information describing a sought movement as a partial movement of an overall movement in an at least partially moved examination region, wherein at least one excitation signal is output with a first frequency band and receiving signals generated by the excitation signal are recorded with a receiving coil arrangement, e.g., a receiving coil arrangement of a magnetic resonance device, having a plurality of receiving channels, wherein the coils of the receiving coil arrangement are designed to record a receiving frequency band including the first frequency band. In addition, the embodiments relate to a magnetic resonance device.

BACKGROUND

Observation of movements inside and/or made by a patient, (e.g., in an examination region), is important or at least useful in many fields of medical examinations and/or interventions. In this regard, different variants have been proposed in particular in respect of imaging, which are based partially on auxiliary devices external to the image recording device, (e.g., respiratory belts, optical monitoring systems and the like), but sometimes also use capabilities of the image recording device itself. It has therefore been proposed, for example, in relation to magnetic resonance imaging, to use what are known as navigators, (e.g., simple, short magnetic resonance sequences to make observations about, for example, the movement of a specific edge, such as the movement of the diaphragm in respect of breathing), and to draw conclusions therefrom about the respiratory movement.

It is with magnetic resonance imaging that movement information proves to be useful for reducing artifacts. If, for example, gradients for spatial encoding are used for recording magnetic resonance data, the recorded magnetic resonance signals are susceptible to movement, and this applies to pure imaging as well as spatially resolved spectroscopic imaging. Movements cannot be completely avoided even with a stationary patient since the breathing as well as the cardiac movement are basically present, e.g., periodic movement patterns that may be taken into account. Existing movement information with respect to a partial movement of this kind may therefore be used, for example, to trigger data recording with a magnetic resonance device.

To ascertain movement information in examination regions, in particular, during magnetic resonance imaging, a novel process has been proposed in DE 10 2015 203 385.6, which is based on the use of an optionally additional excitation signal.

Specifically, it is proposed therein to generate an item of movement information relating to an at least partially moved examination region by outputting, (e.g., emitting), a first excitation signal having a first frequency band, which is then recorded with a receiving coil arrangement, (e.g., with a receiving coil arrangement of a magnetic resonance device), whose receiving frequency band includes the first frequency band. An item of movement information of the examination region may be ascertained from the recorded first excitation signal. This is based on the idea that differences result in the case of receiving signals from movements of the examination object, produced owing to the first excitation signal, which cause a change in the transmission properties of the signal path between the transmitter of the first excitation signal and the receiving coil arrangement. For example, the movement may cause a change in the quality of the coils of the receiving coil arrangement. It may also change the orientation of the receiving coil arrangement. Even when the first excitation signal potentially travels through the examination object, differences may result in the signal path as a function of the movement (change in the signal propagation in the medium). According to the subsequently published application, conclusions are to be made from these differences about the breathing or movement phase. The movement information may be used for movement correction of a scanning signal.

While the process may be carried out without a magnetic resonance device, since the first excitation signal is not a resonance signal, it is nevertheless advantageous to implement the process therein in a magnetic resonance device since there is a receiving coil arrangement present therein anyway. The first frequency band and a third frequency band required for receiving magnetic resonance signals may be located such that both are incorporated by the receiving frequency band of the receiving coil arrangement and, in particular, do not overlap. Therefore, the first frequency band does not collide with the high-frequency signal of the magnetic resonance device, which lies in a second frequency band, and the actual scanning signal, the magnetic resonance signal, which lies in the third frequency band. According to the subsequently published document, the movement information may be ascertained from a signal intensity, (e.g., at least an amplitude), of the receiving signal received on the basis of first excitation signal. In particular, in respect of ascertaining movement information relating to specific partial movements of the overall movement, (for example, respiratory movement or cardiac movement), it may, however, be maintained that all movements of the patient (and, depending on the position of the transmitter, also further movements) are contained in the receiving signals produced on the basis of the first excitation signals, and this may make evaluation difficult.

SUMMARY AND DESCRIPTION

The scope of the present disclosure is defined solely by the appended claims and is not affected to any degree by the statements within this summary. The present embodiments may obviate one or more of the drawbacks or limitations in the related art.

The disclosure is therefore based on the object of disclosing a possibility for deriving at least one item of movement information based on a specific, pre-determined movement, e.g., a respiratory movement and/or cardiac movement, when using a first excitation signal that is to be received by a receiving coil arrangement.

To achieve this object, it is proposed in a method of the type mentioned in the introduction that for ascertaining the movement information, the complex receiving signals of the receiving channels are combined at one instant according to a combination specification ascertained over a period by an analysis of the receiving signals that identifies at least a component of a movement that contributes to the sought movement.

The disclosure is therefore based on the idea of using the presence of a plurality of receiving channels to emphasize specific partial movements of the overall movement, in particular periodic movements, (e.g., breathing and/or heartbeat), or to extract them from the overall movement by way of skilled combination of the receiving signals of different receiving channels. Eight or more receiving channels, or sixteen or more receiving channels, may be used, as is known in modern magnetic resonance devices and their receiving coil arrangements. The at least one suitable combination of receiving signals is described for forming the at least one item of movement information by way of a combination specification to be ascertained, with the combination specification being ascertained, for example, by way of analysis of the complex receiving signals over a period including a plurality of, (e.g., more than one hundred), scanning instants. Different components of the overall movement may be separated for this period by the analysis and the movement components that contribute to the sought, pre-determined movement, which is to be described by the movement information, are selected. As already mentioned, the movement information may describe at least periodic movements, e.g., the breathing and/or the heartbeat of a patient. A complex receiving signal may refer to an item of scanning information that contains the amplitude and phase relating to at least one scanning instant, because it has been found that the phase is also modulated by the movement and is relevant.

The analysis for ascertaining the combination specification is provided since the overall movement of the patient influences the receiving signals, (e.g., the loading of the coils of the receiving coil arrangement), in a potentially unpredictable manner. For example, undesirable patient movements such as turning of the head and/or feet and the like, may influence the receiving signals by adding offsets for the individual receiving channels. The aim of the disclosure is accordingly to ascertain an optimum receiving channel combination that appropriately weights the contributions of the individual receiving channels to suppress, for example, contributions of undesirable patient movement, while the sensitivity to a sought periodic movement, for example, the respiratory movement, is maximized. Reference may be made to the fact that sought, pre-determined movements, which are to be described by the movement information, may be multi-dimensional, the movement information may therefore contain different movement components.

In one embodiment, the movement information is ascertained by way of a linear combination of the complex receiving signals. Linear combinations recommend themselves as a particularly easy to implement combination specification that may be obtained by way of a large number of possible procedures. Different types of analysis are accordingly conceivable within the context of the present disclosure in order to arrive at the combination specification.

One development therefore provides that at least one of the at least one item of movement information is ascertained as at least one principle component of a principle component analysis and/or independent component of an independent component analysis. To ascertain a combination of receiving channels, it may therefore be provided that a complex principle component analysis (PCA) is applied to the receiving signals in the period. Main component analysis deals with the data as a multi-variate Gaussian distribution and calculates the principle components according to their contributions to the overall variance of the data in decreasing order. In this way, the different movement components may be separated provided they are uncorrelated. The linear receiving channel combinations are obtained as main vectors of the principle component analysis. Independent component analysis (ICA) is already known in the prior art. Independent component analysis intensifies the non-Gaussian nature of the independent signal components during separation of the different components of a mixed signal from different sources.

The at least one principle component or independent component to be used as movement information may be selected by a selection criterion and/or be manually selected. While it is therefore conceivable for the correct principle component or independent component to be performed manually by an operator on a display device, (e.g., after displaying all principle components or independent components or all principle components or independent components whose intrinsic value exceeds a threshold value), it is also conceivable, depending on how much is known about the sought movement, to use these known properties to identify the at least one principle component or independent component to be used. In particular, it may be provided that in the case of an item of movement information describing an at least periodic movement, (e.g., the heartbeat and/or the breathing of a patient), the selection criterion includes a bandpass filter that evaluates the frequency range of the periodic movement and/or ascertaining a ratio of the signal energy within the frequency range to the signal energy outside of the frequency range. It is when at least periodic movements are sought in the overall movement, in order to obtain movement information in this regard, that it is frequently known in which frequency range the periodicity of the movement lies for example between 0.1 and 1 Hz in the case of the respiratory movement. Therefore, bandpass filters may be used, with it also being conceivable, in certain examples, to compare the signal energy in the frequency range of the periodic movement with the signal energy in other frequency ranges. If a further measurement signal describing the movement exists, the correlation of the principle components or independent components with this measurement signal, which may also exist for the period, may also be considered as a further part of a selection criterion, moreover. A measurement signal of this kind may, for example, originate from a navigator scan with a or the magnetic resonance device.

However, in a development, it may be provided that where a further measurement signal describing the movement exists, the combination specification is determined in an optimization method that maximizes the correlation of the combination, (e.g., the linear combination), with the measurement signal. In this embodiment, a linear optimization pattern may therefore be used if an additional signal source, which may measure the sought movement, exists. Therefore, the receiving channel combination, (e.g., as a linear combination), may be determined which maximizes the correlation with the additional measurement signal. In particular, the measurement signal is ascertained from a navigator recording ascertained by magnetic resonance imaging during the period. It is precisely during the course of magnetic resonance imaging that navigators, (e.g., magnetic resonance images of the diaphragm for the respiratory movement), are frequently used anyway if no magnetic resonance imaging exists. It is of no consequence that navigator imaging is no longer possible in most cases during the actual magnetic resonance scan since the combination specification has then already been determined and may therefore be used to obtain the current movement information with respect to the sought movement from the current receiving signals.

If the combination specification was ascertained using a specific period, this allows the current movement information to be subsequently ascertained at any further, current instant by its use, without a plurality of successive instants having to be inevitably considered. Notwithstanding this, the disclosure provides that the combination specification is updated by way of analysis for at least one further, at least partially more current period. Therefore, when more data exists, a refined, updated calculation of the combination specification may of course also take place, in that either the previously considered period is supplemented or carried along or a completely new period is selected for the analysis, and this may include more current receiving signals. In this way, it is possible to improve the quality of the combination specification as well as keep this up-to-date.

To prepare the analysis for ascertaining the combination specification, the complex receiving signals may expediently be pre-processed, wherein downsampling, e.g., based on a frequency range of the at least periodic movement, and/or a normalization of the phases of the complex receiving signals to a reference phase of a reference receiving signal may take place. The noise component in the receiving signals may be smoothed or reduced by way of downsampling. For this purpose, a number of consecutive complex samplings, for example, may be averaged in order to obtain a suitable sampling rate for discovering the sought movement by way of analysis, in the case of breathing, (e.g., 10 Hz). The sampling rate is therefore adjusted to the timescale of the sought movement. Scanning of the receiving signals with the receiving coil arrangement may take place on a much faster timescale in that, for example, sampling takes place in a sampling period over a large number of considered sampling instants, spaced apart, (e.g., by 2 to 10 µs), and the respective receiving signals are ascertained for a scanning instant associated with the sampling period from the sampling results over the sampling period, and this will be discussed in more detail below. For example, complex receiving signals may exist every 1 to 10 ms overall, wherein even then further downsampling to a sampling rate that is suitable for identification of the sought movement may be expedient.

Furthermore, all phases may be normalized to a reference phase of a selected reference receiving channel, so only relative phase offsets will be subsequently considered with respect to this reference channel. The reason for this is that the oscillators are not conventionally coupled for signal generation of the excitation signal and on the part of the electronic readout device; a potential phase drift may therefore occur in each readout interval. While coupling of the oscillators would basically be conceivable, the restriction proposed here on the relative phase makes a simplified implementation of processing and hardware possible. In addition to the amplitude, the phase is also modulated by movements and therefore plays a significant role in the analysis undertaken. A phase normalization may occur, for example, by way of multiplication by the complex conjugate of the phase in the reference channel. The normalized complex receiving signals reduced in the sampling rate are then processed further, as described, to separate movement components.

In addition to at least one item of movement information based on an at least periodic movement, (e.g., the heartbeat or the breathing of a patient), at least one further item of movement information based on other movements of the patient may be ascertained. As has been illustrated, the present disclosure is based on the extraction of movement information relating to the breathing and/or heartbeat of the patient, wherein other movement components may be of interest if they may have an effect on the ongoing examination, e.g., imaging. If, for example, an undesirable movement of the patient occurs during the examination, in particular imaging, (e.g., a shift in weight, a movement of an extremity, of the head or the like), results of the examination may be falsified. As such, an item of movement information, which is based on another movement of the patient aside from breathing and the heartbeat, may be used, for example, to trigger or influence decisions such as a recalibration, the repetition of an image recording or the repositioning of the patient, either automatically or also at least partially manually. The latter may also be enabled by displaying this further movement information and/or information derived therefrom for an operator.

It may also be noted that embodiments allow the examination mode, (e.g., imaging mode), to be controlled as a function of the movement information. Therefore, for example, an item of movement information based on an at least periodic movement may be used to trigger individual imaging processes, to make movement corrections in recorded image data and the like, as is known for previous movement information ascertained in some other way. In this case, the at least one item of movement information is evaluated automatically therefore.

However, it may also be provided that the at least one item of movement information is presented in a display on a display device. In particular, the presentation of the movement information may be based on the amplitude and/or value of the combination of complex receiving signals. Since the combination specification may be applied virtually in real time, fast visual feedback of the movement information is possible, wherein, for example, different principle components or independent components and/or different movement information may be presented on an online display, wherein the display may be based on the amplitude or even the value of the combination of the complex receiving signals. This online display may be used to monitor the patient movement, and also make workflow decisions manually, in particular when, in addition to an item of movement information that relates to an at least periodic movement, further items of movement information that relate to other movements of the patient are ascertained and presented. Updating a display of this kind may be geared toward an image recording interval of a simultaneously used image recording device, or may be configured thereto.

To generate expedient displays of the movement information, a further embodiment provides that an item of cycle information describing an instant or section of the periodic movement cycle is ascertained during recording of an image with an or the simultaneously used image recording device from an item of movement information based on an at least periodic movement, in particular, the heartbeat or the breathing of a patient, and/or the movement information during recording of the image and/or the cycle information is stored with the image and/or so as to be associated with the image. It is therefore conceivable to average the movement information for a recording period of an image or an interval of recording of images, to adapt to the imaging rate therefore, or to obtain averaged movement information based on an image recording, which may be stored, for example, as an overlay and/or image content within the image and/or so as to be associated with the image, and this is particularly advantageously possible if the image is stored in DICOM format. With repeated recording of images, for example, during a monitoring task, it is then possible to display the resulting image stream on the display device in a real-time window. It is therefore possible to easily see not just the image information but also the movement information based on the at least periodic movement.

In an embodiment, the receiving signals are superimposed with at least one further useful signal, (e.g., a magnetic resonance signal), and are recorded as an overall signal and are extracted from the overall signal. As already mentioned and illustrated in the introduction, the method to obtain the receiving signals is applied particularly advantageously in a magnetic resonance device in which its receiving coil arrangement that is present anyway may be used to obtain the receiving signals. Conventional receiving coil arrangements for magnetic resonance devices have a plurality of receiving channels anyway and are therefore suitable for carrying out the method. Its receiving frequency band then includes the first frequency band as well as the further frequency band of the useful signal/magnetic resonance signal, which may not overlap. The embodiments of subsequently published DE 10 2015 203 385.6 described with respect to integration in a magnetic resonance device and its operation may also be transferred to the present disclosure, so the corresponding statements of this document are incorporated in the disclosure of the present application by reference.

Since the movements of the patient (or, for example, of the examination region) modulate the excitation signal in the case of its basic frequency, this basic frequency of the excitation signal is known as accurately as possible at the instant of recording the receiving signals in order to also be able to extract the correct information as receiving signals from the overall signal. The situation may occur where the information on the part of a transmitting device may not be sufficient for the excitation signal.

Within the context of the present disclosure, the basic frequency of the receiving signals is ascertained in a calibration act, and this is used in an extraction act for extraction of the complex receiving signals. For optimally accurate determination of the basic frequency, it may be provided that this is ascertained from an evaluation of the overall signals themselves. Background knowledge about the excitation signal (and therefore the receiving signal) compared to the useful signal may be exploited in this connection. For magnetic resonance imaging it is reasonable to assume that the value (the magnitude) of the receiving signal, as is produced due to the excitation signal, varies only slightly when compared with the magnetic resonance signals that may not have constant values over time and different channels. While the excitation signal is modulated only slightly by the movement, for example in the region of a few percent, the magnetic resonance signal is strongly modulated at the latest by the spatial encoding.

In the calibration act, (e.g., after pre-filtering with a window filter), signal magnitudes of the overall signals, averaged over all receiving channels, are divided for predetermined frequency intervals by the corresponding difference, (e.g., variance), of the signal magnitudes over considered sampling instants of a sampling period and receiving channels and the basic frequency is ascertained from results of division that exceed a threshold value. Depending on the type of reading out in the sampling period, different pre-filtering operations may be expedient to avoid interference frequencies/overshoots that occur erroneously. It is therefore known, for example, to not actually read out over the entire sampling period, e.g., to not read out for all sampling instants, but to set some scan values that have not been read out, for example from a specific sub-instant, to zero (e.g., asymmetric sampling). In this case, a Hanning window filter has also proven to be useful as a window filter to suppress what is known as the "frequency leakage" effect that results due to the finite sampling. With the assumption that the value of the receiving signals is comparatively constant over the sampling period, it is therefore proposed, in particular after a Fourier transformation and elimination of different signal phases, (e.g., by magnitude formation), to average the values of the signal components for individual frequency intervals over all receiving channels and to generate a type of magnitude image in which the value is divided by the variance of the values of the frequency intervals over time and over all receiving channels. In this way, effectively all non-constant signal components are suppressed, so only signal components emanating from the excitation signal remain.

Specifically, the basic frequency may be determined within the context of an interpolation, (e.g., by the first moment), of the remaining division results. This means, after using the threshold value and therefore disappearance of other signal components, a value that is fractional with respect to division into the frequency intervals is determined for the frequency maximum by appropriately weighted consideration of the remaining signal components, which value therefore indicates the position of the basic frequency irrespective of the digital scanning of the frequency interval. Since the frequencies may be considered relative to the current center frequency of the magnetic resonance device, and this may be applicable, there may optionally be a corresponding back calculation to an absolute value for the basic frequency, although with knowledge of the recording conditions this is possible without problems.

Once the basic frequency is known, known possibilities may be used to extract and assess the receiving signals for the complex receiving signal for the sampling period or to obtain a scanning instant associated therewith. It may therefore be provided that for extraction of the complex receiving signals from the overall signal for a scanning instant associated with the sampling period, a reference signal of the basic frequency is generated and the complex amplitude is ascertained for each receiving channel, e.g., the overall signal is multiplied by the complex conjugate of the reference signal and averaged over all sampling instants. A complex, harmonic reference signal of the basic frequency is therefore generated and with unit amount with the basic frequency and with unit amount with the sampling rate of reading out, so the amplitude and the phase of the receiving signals are firstly multiplied for each sampling instant by multiplication of the overall signal by the complex conjugate of the reference signal, and are then averaged over the sampling period.

Reference is made to the fact that, particularly in the case of magnetic resonance imaging, attention may be paid to the current readout conditions relating to the basic frequency, e.g., the center frequency and the slice offset, the readout bandwidth, the basic resolution, or readout asymmetries.

Since the receiving signals may be determined in this manner it is also possible to easily extract the magnetic resonance signal (or, for example, the useful signal) in that for extraction of the useful signal, which is to be processed further separately, the complex receiving signal multiplied by the reference signal is subtracted from the overall signal. High-quality magnetic resonance images may therefore be reconstructed without problems from a magnetic resonance signal as the useful signal obtained in this way.

Apart from the method, the disclosure also relates to a magnetic resonance device, having a receiving coil arrangement and a controller designed to carry out the method. All statements relating to the method may be transferred analogously to the magnetic resonance device with which the advantages already mentioned may therefore be obtained. In particular, the controller may therefore include an analysis unit for ascertaining the combination specification and a combination unit for application of the combination specification to obtain at least one item of movement information.

The disclosure also relates to a computer program that carries out the acts of a method when run on an arithmetic device, (e.g., the controller of the magnetic resonance device). Finally, the disclosure relates to an electronically readable data carrier having a computer program stored thereon, which may be a non-transient data carrier, (e.g., a CD-ROM). All statements relating to the method and to the magnetic resonance device may also apply to the computer program and the electronically readable data carrier.

BRIEF DESCRIPTION OF THE DRAWINGS

Further advantages and details of the present disclosure may be found in the exemplary embodiments described below and with reference to the drawings, in which:

FIG. 5 depicts an example for displaying movement information.

DETAILED DESCRIPTION

Figure 1:
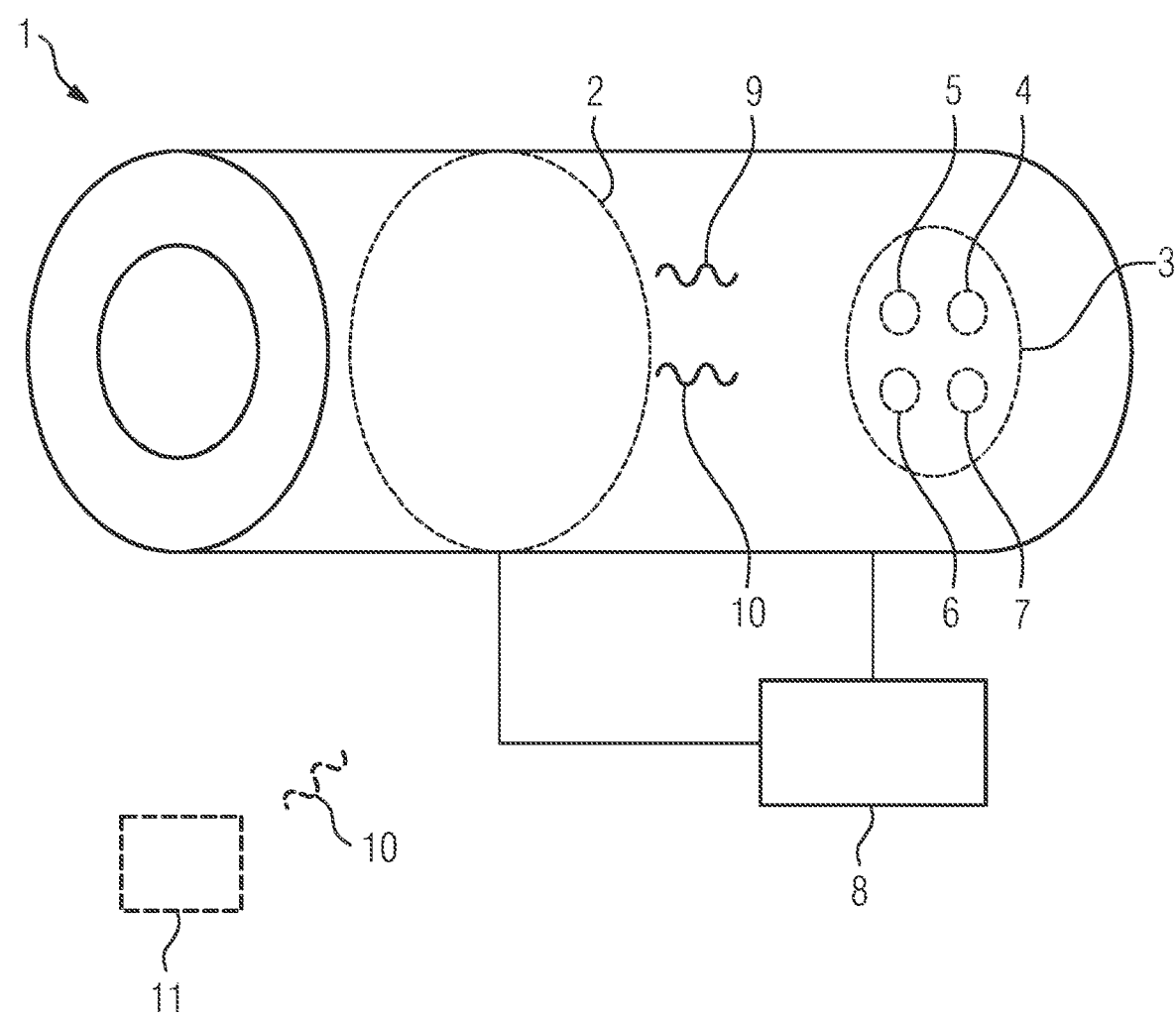
FIG. 1 depicts a schematic diagram of a magnetic resonance device according to one example.

FIG. 1 depicts a diagram of a magnetic resonance device 1. This includes a high-frequency coil 2, designed here as a body coil, and a receiving coil arrangement 3 in the form of a coil array, wherein four coils 4, 5, 6 and 7 are depicted here, although further coils may also be present. The receiving coil arrangement provides a plurality of receiving channels, in the present case 32 receiving channels by way of example. A body coil such as the high-frequency coil 2 is used to excite spins in the examination region in that a high-frequency signal 9 is output at the resonance frequency, in the present case of protons. In the present case, the high-frequency signal 9 is output with a bandwidth of 0.5 MHz to 1.0 MHz. The center frequency depends on the resonance frequency of the nuclei to be excited and the magnetic field strength of the magnetic resonance device 1. In the case of protons and a magnetic field strength of 1.5 tesla the resonance frequency, and therewith the center frequency of the high-frequency signal 9, is conventionally 63.9 MHz. The receiving coil arrangement 3 is provided for reading out the magnetic resonance signals. The coils 4, 5, 6 and 7 of the coil array scan the magnetic resonance signal simultaneously.

In the present case, the high-frequency coil 2 is also used for outputting, (e.g., emitting), an excitation signal, for which reason it may be changed, so the frequency band of the high-frequency signal 9 and the frequency band of the excitation signal 10 are spaced apart from each other. In an alternative embodiment, depicted only in broken lines here, the excitation signal 10 may also be output by an external transmitting unit 11, in particular, as a continuous wave signal, since the external transmitting unit 11 is not affected by a changeover from transmitting to receiving chain of the coils of the magnetic resonance device 1.

Irrespective of the embodiment of the unit for outputting the excitation signal 10, receiving signals produced by the excitation signal 10 are detected by the receiving coil arrangement 3 of the magnetic resonance device 1. Possible embodiments for use of the receiving bandwidth of the receiving coil arrangement 3 may be found in DE 10 2015 203 385.6.

Figure 2:
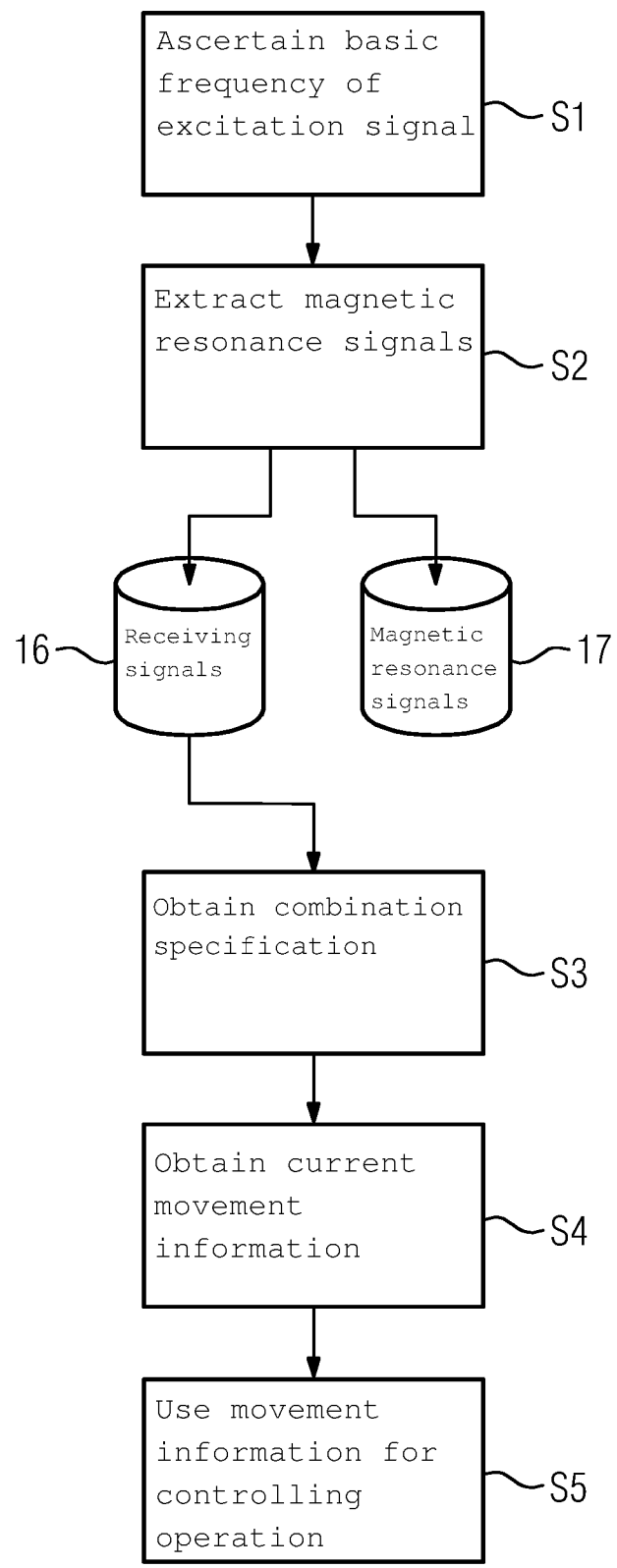
FIG. 2 depicts a flowchart of an exemplary embodiment of the method.

During scanning operation of the magnetic resonance device an overall signal is recorded by the receiving coil arrangement 3, which, in addition to the receiving signals, also contains the magnetic resonance signals for the individual receiving channels. The exemplary embodiment of the method illustrated below with reference to FIG. 2 refers to the processing and evaluation of an overall signal of this kind, which method may be carried out by the controller 8 of the magnetic resonance device 1, likewise indicated in FIG. 1.

In act S1, the basic frequency of the excitation signal 10, and therefore the frequency at which the sought receiving signals lie in the overall signal, is ascertained from the overall signals of the receiving channels as a calibration act. For this purpose, a window filter, which may take account of asymmetric sampling and/or another sampling property, is applied to the overall signals of the receiving channels in a sampling period in which very frequent sampling of the overall signal occurs at sampling instants. Sampling periods of this kind each define a scanning instant, since, as will be illustrated in more detail below, the receiving signals are each produced so as to be averaged over a sampling period of this kind, since the movement is ultimately described by the modulation thereof which takes place on a slower timescale.

Figure 3:
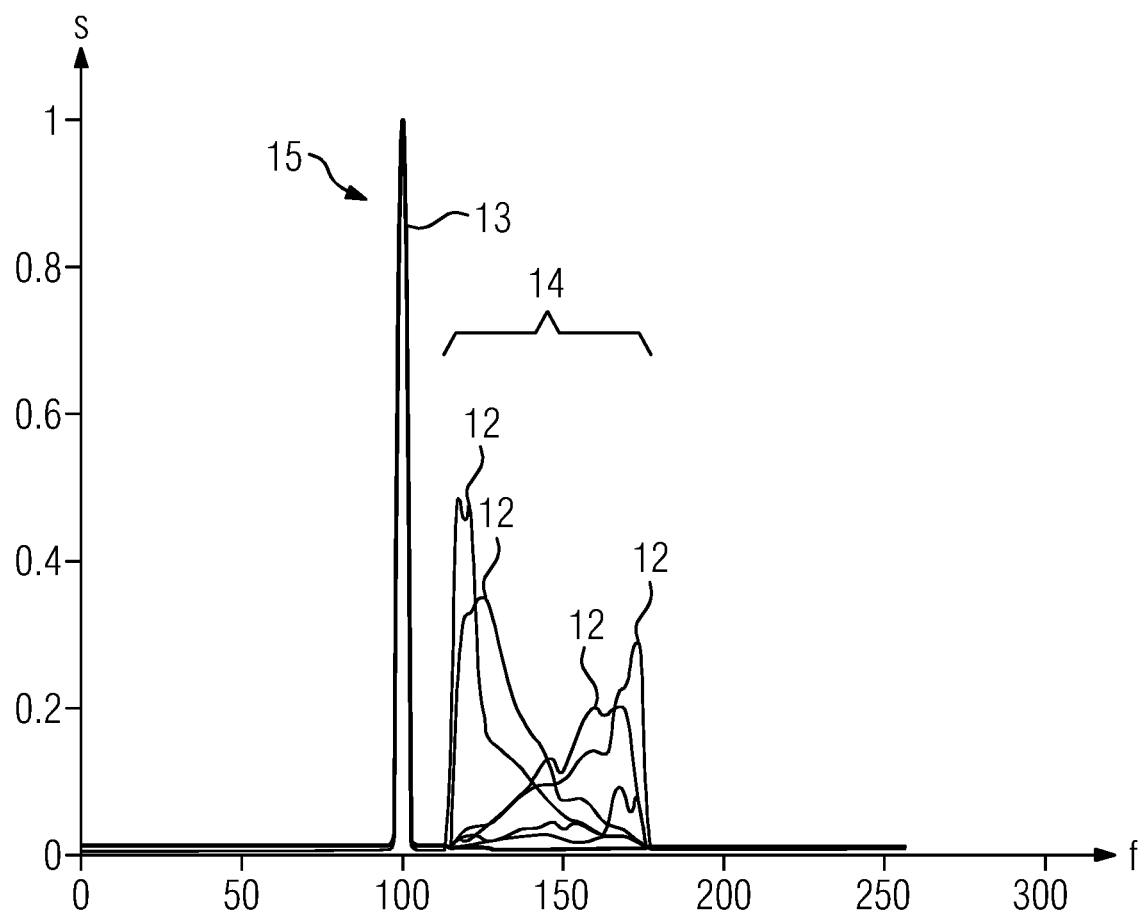
FIG. 3 depicts a graph to illustrate ascertaining of the basic frequency according to an example.

To ascertain the basic frequency, a Fourier transformation is carried out, with the values (e.g., magnitudes) of the overall signal resulting in a manner broken down according to frequency intervals ("frequency pixels"). While it may be assumed for the magnetic resonance signal that this is distinguished by frequent variations in magnitude, with respect to the receiving signals resulting from the excitation signal, it may be assumed that the magnitude varies only slightly over the sampling period. The magnitudes averaged over all receiving channels are therefore related per frequency interval to the variance of these magnitudes over time and all receiving channels. The result of a process of this kind may be found in FIG. 3, where magnitude characteristics 12 for different receiving channels are depicted plotted against the frequency. Furthermore, the characteristic 13 of the division results is depicted in bolder print. It may be seen that as a result of division the components of the magnetic resonance signals lying in the second frequency band 14 of the magnetic resonance signals are suppressed due to the high variance, while the peak 15 that may be unchanged for all receiving channels and sampling instants is emphasized in the case of the basic frequency.

Accordingly, the suppressed magnetic resonance signal components are removed in act S1 by a threshold value operation and the basic frequency may be determined quite accurately by way of the first moment of the remaining division results. With knowledge of the current recoding conditions (e.g., center frequency, slice offset, etc.) an absolute value may therefore be ascertained for the basic frequency if the consideration so far has been relative.

It is sufficient in this connection to determine the value for the basic frequency once during an examination and/or cyclically at relatively large intervals since it is unchanged. However, depending on the specific embodiment of the evaluation and calculation processes, the current recording conditions in each case may be adequately taken into account (if required).

In act S2, the determined basic frequency is used to extract the magnetic resonance signals. For this purpose, a reference signal is generated with the basic frequency and unit amount at the sampling rate of reading out, and this may refer to a model for the anticipated complex receiving signal. The amplitudes and phases of the receiving signals, (e.g., the complex receiving signal), for each sampling instant may then be obtained by multiplication of the overall signal for the receiving channel by the complex conjugate of the reference signal, with an average of all sampling instants being formed to obtain complex receiving signals for each receiving channel at a scanning instant associated with the sampling period.

At the same time, it is possible to extract the magnetic resonance signals in that similarly for each specifically sampled scan value, the accordingly obtained complex receiving signal multiplied by the reference function at the sampling instant is subtracted from the overall signal. The results of act S2 are therefore separately the receiving signals 16 for all receiving channels and the magnetic resonance signals 17 for all receiving channels. Further evaluation of the magnetic resonance signals 17 is not a subject of the current description and may occur as is basically known in the prior art.

In act S3, a combination specification may be obtained by way of analysis of the complex receiving signals 16 for a period including a plurality of, for example 100 or more, scanning instants, which specification describes a combination of the receiving channels such that the movement information resulting from the combination describes a sought movement as a partial movement of the overall movement of the patient, wherein a plurality of sought movements may of course also be considered, for example breathing and heartbeat. In other words, the sought (e.g., partial) movements (of the overall movement) may be at least periodic movements. The respiratory movement of the patient shall be mapped below by way of the movement information as an example of the sought, pre-determined movement.

To ascertain the combination specification there is firstly a downsampling of the complex receiving signals 16 and a phase normalization of the receiving signals 16 in a preprocessing act of act S3. Downsampling is used to select a suitable sampling rate for the sought respiratory movement, for example 10 Hz. Noise components in the receiving signals 16 may therefore be smoothed. A reference phase of a selected receiving channel (e.g., reference channel) is used for phase normalization in order to consider only phase offsets relative to this reference phase further. Coupling of oscillators may therefore be avoided and a simpler embodiment of the calculations as well as the hardware may be achieved. For phase normalization multiplication by the complex conjugate of the phase of the scanning instant occurs in the reference channel.

In the present case, a linear combination of the receiving signals of the various receiving channels shall accordingly be found, which may describe the breathing, for which purpose different possibilities exist. A principle component analysis (PCA) or an independent component analysis (ICA) may applied to find principle components or independent components that describe different movement components of the overall movement. The correct principle components or independent components, here the ones that describe breathing, may then be selected manually by an operator, although it also conceivable to use background knowledge about the sought movement, here the respiratory movement, to be able to identify these proper principle components or independent components. Since the periodicity of breathing lies in a specific frequency band, a corresponding band filter, for example, may be used, in particular, in order to compare the signal energy in the frequency range, in which breathing conventionally takes place, with the signal energy in other frequency ranges. One selection criterion may evaluate the results of a consideration of this kind and ascertain a corresponding linear combination (which optionally corresponds to the selection of a specific principle component or independent component, but may also include a plurality of principle components or independent components) as the combination specification. A selection criterion of this kind may particularly advantageously also take into account other measurement signals relating to the period, which describe the sought movement, here the breathing, by considering the correlation of principle components or independent components with this measurement signal in order to be able to find movement components that contribute to the sought movement. A measurement signal of this kind may be derived within the course of magnetic resonance imaging for example from a (or a plurality of) navigator(s) that observe, for example, the diaphragm and/or the abdominal wall and/or the sternum, although other possibilities are also conceivable, for example use of a breathing belt or the like.

Figure 4:
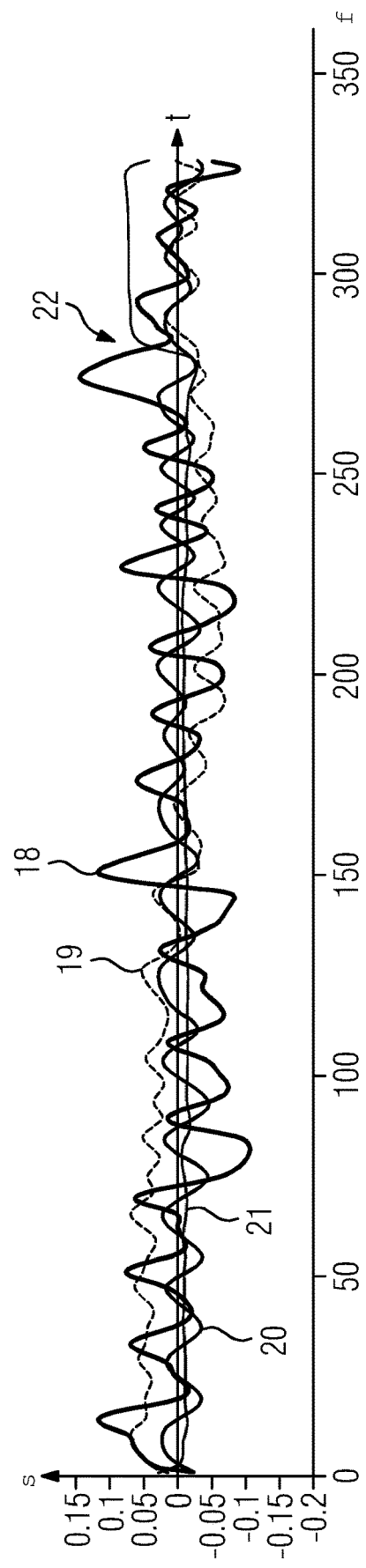
FIG. 4 depicts principle components of a principle component analysis according to an example.

This is illustrated in more detail in respect of FIG. 4, which depicts the characteristic of a plurality of principle components 18, 19, 20 and 21, whose intrinsic value exceeds, (for example, a threshold value), against time. The respiratory movement is given here by the principle component 20, e.g., a periodic movement component. The principle component 21, which may move around zero until it jumps to a higher value at a later instant 22, is also extremely notable in this context. This is an indication that the patient himself has changed position here.

Overall it may therefore be expedient to also derive or consider movement information that is not based on a sought, at least periodic movement, here the respiratory movement, since this kind of movement information, here the combination according to the principle component 21, may provide indications of undesirable patient movements. The same considerations may of course also be employed in the case of independent components.

Once the at least one combination specification has been ascertained for the at least one item of movement information in act S3, it may be applied in act S4 to current complex receiving signals to obtain current movement information. It is possible to update the combination specifications at any time by adding further and/or more current scans in order to increase the overall quality of the movement information.

In act S5, the ascertained movement information may then be used firstly for controlling operation of the magnetic resonance device 1 by automatic evaluation, but secondly also for visual evaluation, for which purpose the movement information may be displayed on a display device of the magnetic resonance device 1.

FIG. 5 illustrates one possible presentation 23, with the individual items of movement information 25, 26 being visualized in a real-time presentation in sub-windows 24, wherein these do not inevitably have to be depicted as continuous graphs but may also be color-coded or be reproduced in a similar way. For example, here the movement information 25 may correspond to the principle component 20, and the movement information 26 may correspond to the principle component 21. For example, repositioning of the patient, a repetition of a magnetic resonance imaging sequence and the like may be arranged by an operator as a reaction to the undesirable movement of the patient described by the movement information 26.

For displaying the movement information 25, 26, UI elements already used nowadays in relation to breathing and/or the heartbeat, (e.g., display windows), may still be used, as have been used, for example, for displaying an ECG and/or the signals of a navigator/breathing belt.

Movement information may also be visualized in images or integrated therein, in particular, in the case of monitoring processes in which images are recorded at a specific image recording rate. For this purpose, the movement information is expediently considered in a manner averaged with respect to the image recording rate and stored, for example, in a DICOM image as an overlay, gray-scale information and/or metainformation. The corresponding resulting image stream may be displayed in real time with a visualization of the movement information.

It should also be noted that the present disclosure may also be used in hybrid imaging devices including a magnetic resonance system, for example, in combinations of the magnetic resonance imaging with PET imaging and/or in combinations of X-ray imaging with magnetic resonance imaging.

Although the disclosure has been illustrated and described in more detail by the exemplary embodiment, the disclosure is not limited by the disclosed examples and a person skilled in the art may derive other variations herefrom without departing from the scope of the disclosure.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for ascertaining an item of movement information describing a sought movement as a partial movement of an overall movement in a moved examination region, the method comprising:
    outputting an excitation signal having a first frequency band and a high-frequency signal having a second frequency band that does not overlap with the first frequency band;
    recording receiving signals and a magnetic resonance signal as an overall signal, wherein the receiving signals are generated by the excitation signal with a receiving coil arrangement of a magnetic resonance device having a plurality of receiving channels, wherein the magnetic resonance signal is generated by the high-frequency signal, and wherein coils of the receiving coil arrangement are configured to record a receiving frequency band comprising the first frequency band and the second frequency band;
    extracting complex receiving signals from the overall signal using a basic frequency of the receiving signals, wherein the complex receiving signals comprise scanning information having amplitudes and phases relating to sampling instants associated with a sampling period, and wherein a reference signal of the basic frequency is generated from the overall signal to extract the complex receiving signals; and
    ascertaining the movement information describing the sought movement, wherein the complex receiving signals of the receiving channels are combined at one instant according to a combination specification ascertained over a period by an analysis of the complex receiving signals that identifies at least one component of a movement that contributes to the sought movement.

2. The method of in claim 1, wherein the movement information is ascertained by a linear combination of the complex receiving signals.

3. The method of in claim 2, wherein the movement information is ascertained as a principle component of a principle component analysis, an independent component of an independent component analysis, or both the principle component and the independent component.

4. The method of claim 3, wherein the principle component or the independent component is selected by a selection criterion or is manually selected.

5. The method of claim 4, wherein, with a periodic movement, the selection criterion comprises a bandpass filter that selects a frequency range of the periodic movement and/or ascertains a ratio of a signal energy within the frequency range to a signal energy outside of the frequency range.

6. The method of claim 5, wherein the periodic movement is a heartbeat of a patient, breathing of the patient, or both the heartbeat and breathing of the patient.

7. The method of claim 4, further comprising:
    determining the combination specification in an optimization method that maximizes a correlation of the linear combination of the complex receiving signals with a measurement signal describing a periodic movement.

8. The method of claim 7, wherein the measurement signal is ascertained from a navigator recording ascertained by magnetic resonance imaging during the period.

9. The method of claim 7, wherein the combination specification is updated by way of analysis for at least one further period that is at least partly more current.

10. The method of claim 1, wherein as pre-processing of the complex receiving signals, downsampling occurs, based on a frequency range of a periodic movement, and/or a normalization of the phases of the complex receiving signals to a reference phase of a reference receiving signal.

11. The method of claim 1, wherein the item of movement information is based on periodic movements of a patient including a heartbeat and/or breathing of the patient, and the method further comprises:
    ascertaining an additional item of movement information based on other movements of the patient.

12. The method of claim 1, further comprising:
    automatically evaluating the movement information and/or presenting the movement information in a display on a display device.

13. The method of claim 12, wherein the presentation of the movement information is based on either or both of an amplitude or value of the combination of the complex receiving signals, and wherein an updating period and/or a temporal display is/are configured to an image recording interval of a simultaneously used image recording device.

14. The method of claim 1, wherein an item of cycle information describing an instant or section of a periodic movement cycle is ascertained during recording of an image with simultaneously used image recording device from an item of movement information based on an at least periodic movement, in particular a heartbeat or a breathing of a patient and/or the movement information during recording of the image and/or the cycle information is stored so as to be associated with the image and/or the image.

15. The method of claim 1, wherein signal magnitudes of the overall signal averaged over all receiving channels are divided for pre-determined frequency intervals by a corresponding difference of the signal magnitudes over considered sampling instants of the sampling period and receiving channels, and the basic frequency is ascertained from results of division that exceed a threshold value.

16. The method of claim 15, wherein the basic frequency is ascertained after pre-filtering with a window filter.

17. The method of claim 15, wherein the corresponding difference is a variance.

18. The method of claim 15, wherein the basic frequency is determined within a framework of an interpolation of the remaining results of division.

19. The method of claim 15, wherein the basic frequency is determined within a framework of an interpolation by a first moment of the remaining results of division.

20. The method of claim 1, wherein, for each receiving channel, the overall signal is multiplied by a complex conjugate of the reference signal and averaged over all sampling instants.

21. The method of claim 20, wherein the complex receiving signal multiplied by the reference signal is subtracted from the overall signal to extract at least one further signal.

22. A magnetic resonance device comprising:
a receiving coil arrangement; and
a controller configured to:
output an excitation signal having a first frequency band and a high-frequency signal having a second frequency band that does not overlap with the first frequency band;
record receiving signals and a magnetic resonance signal as an overall signal, wherein the receiving signals are generated by the excitation signal with the receiving coil arrangement of the magnetic resonance device having a plurality of receiving channels, wherein the magnetic resonance signal is generated by the high-frequency signal, and wherein coils of the receiving coil arrangement are configured to record a receiving frequency band comprising the first frequency band and the second frequency band;
extract complex receiving signals from the overall signal using a basic frequency of the receiving signals, wherein, a reference signal of the basic frequency is generated from the overall signal to extract the complex receiving signals for a scanning instant associated with a sampling period, and for each receiving channel, the overall signal is multiplied by a complex conjugate of the reference signal and averaged over all sampling instants; and
ascertain movement information describing a sought movement, wherein the complex receiving signals of the receiving channels are combined at one instant according to a combination specification ascertained over a period by an analysis of the receiving signals that identifies at least one component of a movement that contributes to the sought movement.

23. A computer program stored on a non-transitory electronically readable data carrier of an arithmetic device, wherein the computer program, when executed, is configured to:
output an excitation signal having a first frequency band and a high-frequency signal having a second frequency band that does not overlap with the first frequency band;
record receiving signals and a magnetic resonance signal as an overall signal, wherein the receiving signals are generated by the excitation signal with a receiving coil arrangement of a magnetic resonance device having a plurality of receiving channels, wherein the magnetic resonance signal is generated by the high-frequency signal, and wherein coils of the receiving coil arrangement are configured to record a receiving frequency band comprising the first frequency band and the second frequency band;
extract complex receiving signals from the overall signal using a basic frequency of the receiving signals, wherein the complex receiving signals comprise scanning information having amplitudes and phases relating to sampling instants associated with a sampling period, and wherein a reference signal of the basic frequency is generated from the overall signal to extract the complex receiving signals; and
ascertain movement information describing a sought movement, wherein the complex receiving signals of the receiving channels are combined at one instant according to a combination specification ascertained over a period by an analysis of the complex receiving signals that identifies at least one component of a movement that contributes to the sought movement.

24. A non-transitory electronically readable data carrier comprising:
a computer program stored on the electronically readable data carrier, wherein the computer program, when executed, is configured to:
output an excitation signal having a first frequency band and a high-frequency signal having a second frequency band that does not overlap with the first frequency band;
record receiving signals and a magnetic resonance signal as an overall signal, wherein the receiving signals are generated by the excitation signal with a receiving coil arrangement of a magnetic resonance device having a plurality of receiving channels, wherein the magnetic resonance signal is generated by the high-frequency signal, and wherein coils of the receiving coil arrangement are configured to record a receiving frequency band comprising the first frequency band and the second frequency band;
extract complex receiving signals from the overall signal using a basic frequency of the receiving signals, wherein the complex receiving signals comprise scanning information having amplitudes and phases relating to sampling instants associated with a sampling period, and wherein a reference signal of the basic frequency is generated from the overall signal to extract the complex receiving signals; and
ascertain movement information describing a sought movement, wherein the complex receiving signals of the receiving channels are combined at one instant according to a combination specification ascertained over a period by an analysis of the complex receiving signals that identifies at least one component of a movement that contributes to the sought movement.

\* \* \* \* \*